United States Patent
Lee et al.

(10) Patent No.: US 7,064,986 B2
(45) Date of Patent: Jun. 20, 2006

(54) NON-VOLATILE SEMICONDUCTOR MEMORY DEVICE USING DIFFERENTIAL START PROGRAMMING VOLTAGE AND PROGRAMMING METHOD THEREOF

(75) Inventors: Kyeong-Han Lee, Gyeonggi-do (KR); June Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 17 days.

(21) Appl. No.: 10/925,694

(22) Filed: Aug. 24, 2004

(65) Prior Publication Data

US 2005/0141283 A1    Jun. 30, 2005

(30) Foreign Application Priority Data

Dec. 30, 2003    (KR) ............... 10-2003-0100108

(51) Int. Cl.
*G11C 16/00*    (2006.01)

(52) U.S. Cl. ............... 365/185.28; 365/185.09; 365/185.23; 365/200

(58) Field of Classification Search ............... None
See application file for complete search history.

(56) References Cited

U.S. PATENT DOCUMENTS

| | | | |
|---|---|---|---|
| 4,803,656 A * | 2/1989 | Takemae | ............... 365/200 |
| 5,581,504 A * | 12/1996 | Chang | ............... 365/185.17 |
| 5,894,435 A | 4/1999 | Nobukata | |
| 6,335,881 B1 | 1/2002 | Kim et al. | |
| 6,480,419 B1 * | 11/2002 | Lee | ............... 365/185.18 |
| 6,661,707 B1 * | 12/2003 | Choi et al. | ............... 365/185.17 |
| 6,717,861 B1 * | 4/2004 | Jeong et al. | ............... 365/185.28 |
| 6,813,187 B1 * | 11/2004 | Lee | ............... 365/185.18 |

OTHER PUBLICATIONS

Kang-Deog Suh, et al., "A 3.3 V 32 Mb Nand Flash Memory with Incremental Step Pulse Programming Scheme", IEEE Journal of Solid-State Circuits, vol. 30, No. 11, Nov. 1995, 8 Pgs.

* cited by examiner

*Primary Examiner*—Tan T. Nguyen
(74) *Attorney, Agent, or Firm*—Marger Johnson & McCollom, P.C.

(57) ABSTRACT

In a non-volatile semiconductor memory device which differentially uses a start programming voltage during a programming operation mode in order to reduce a dispersion for the number of programming loops, the programming method includes previously storing a row address that indicates at least one specific word line among a plurality of word lines; and applying a start programming voltage to the specific word line, when a row address applied in a programming operation mode coincides with the stored row address, the start programming voltage having a level that is different from a level of start programming voltage to be applied to the rest word lines except the specific word line, whereby reducing dispersion for the programming loop number and realizing a high-speed programming operation and operating efficiency.

26 Claims, 14 Drawing Sheets

NON-VOLATILE SEMICONDUCTOR MEMORY DEVICE USING DIFFERENTIAL START PROGRAMMING VOLTAGE AND PROGRAMMING METHOD THEREOF

CROSS REFERENCE TO RELATED APPLICATION

This application claims priority under 35 USC § 119 to Korean Patent Application No. 2003-100108, filed on Dec. 30, 2003, the contents of which are herein incorporated by reference in their entirety for all purposes.

FIELD OF THE INVENTION

The present invention relates to a non-volatile semiconductor memory device, and particularly, to a non-volatile semiconductor memory device having a programming circuit for programming a memory cell having a floating gate, and a programming method thereof.

PRIOR ART OF THE INVENTION

A non-volatile semiconductor memory device such as a flash EEPROM (electrically erasable programmable read only memory) etc. is generally widely known as a data storage device of portable electronic system. A NAND flash semiconductor memory device having a memory cell array of NAND cell type is widely known in this field as a memory where integration of memory cells is relatively prominent and a flash is erasable. In a programming operation of the NAND flash semiconductor memory device, a high voltage, such as 15V through 20V, relatively higher than power source voltage, is applied to a selected word line.

A technical example for a programming method of the NAND flash semiconductor memory device is disclosed in U.S. Pat. No. 6,335,881 granted Jan. 1, 2002, to Kim, Jong-Hwa et al., and this is incorporated by reference herein.

Further, to make a threshold voltage dispersion width in the programming memory cell densely, a programming method of "an incremental step pulse programming (ISPP) scheme" is disclosed in this field. In the ISPP scheme, a programming voltage VPGM has a pulse type of determined width increased per stage from a minimum voltage to a maximum voltage during a repeated programming cycle. The ISPP scheme is disclosed in IEEE Journal of Solid-State Circuits, vol. 30, No. 11, November 1995, pp.1149–1156 (Suh, Kang-Deog, et al.) under the title of "A 3.3V 32 Mb NAND Flash Memory with Incremental Step Pulse Programming Scheme", and this is also incorporated as the reference of the present invention.

In a programming operation mode of the NAND flash semiconductor memory device, a bitline connected with a selected memory cell is changed to a level of ground voltage from a power source voltage, and a programming voltage is resultantly applied to a word line connected with a control gate of the selected memory cell, and a pass voltage is applied to word lines connected with control gates of non-selected memory cell.

Describing more in detail a procedure that the programming voltage is applied resultantly to the selected word line, the pass voltage is first applied to all word lines, then a start programming voltage, such as 15.5V, is applied only to a selected word line for a determined time, such as 15 microseconds. Subsequently, a well-known program verification read operation is performed, and if the verified result is failed, the number of programming loops is increased, thus the programming voltage, such as 16V, increased by a determined level from the start programming voltage, is applied to the selected word line for a determined time. The number of programming loops can be determined, such as 12 times.

The number of programming loops depends upon a level of the programming voltage applied to the selected word line and upon a time while the programming voltage is applied. In other words, the higher the programming voltage and the longer the applied time of programming voltage, the less the number of programming loops is needed. However, since positions or architectures of word lines within a memory cell block are not same as one another, dispersion for the number of programming loops appears relatively large. For example, if there exists a memory cell string that sixteen memory cells are serially connected, every memory cell block, first and sixteenth word lines each connected to first and sixteenth memory cells have a large parasitic loading capacitance as compared with other word lines. The number of programming loops in programming that word line can become relatively many, as compared with the number of programming loops for other word lines. Consequently, when the dispersion of the programming loop number becomes large, a time taken for an overall programming operation is increased and not only the programming operation but also efficiency of read operation falls.

That is, in the programming method of the non-volatile semiconductor memory device according to the prior art, the start programming voltage of the same level is applied to the selected word line regardless of a loading that each word line has. The programming voltage is increased by the ISPP scheme. Thus, there is a difficulty in reducing the dispersion for the number of programming loops.

SUMMARY OF THE INVENTION

A feature of the present invention is to provide a non-volatile semiconductor memory device capable of solving the problems of the prior art.

Another feature of the present invention is to provide a non-volatile semiconductor memory device having a programming circuit, which is capable of reducing dispersion for the number of programming loops.

Another feature of the present invention is to provide a non-volatile semiconductor memory device having a programming circuit, and a programming method thereof, which uses a differential start programming voltage per word line.

Another feature of the present invention is to provide a non-volatile semiconductor memory device having a programming circuit, and a programming method thereof, in which an initial programming voltage can be applied highly rather to some of word lines even without largely increasing an occupied area of chip, the some of word lines being decided by such a characteristic that the programming loop number thereof is more than the averaged programming loop number.

To achieve the above features, according to one aspect of the present invention, a programming method in a non-volatile semiconductor memory device includes previously storing a row address that indicates at least one specific word line among a plurality of word lines; and applying a start programming voltage to the specific word line, when a row address applied during a programming operation mode coincides with the stored row address, the start programming voltage having a level that is different from a level of a start programming voltage to be applied to the rest word lines except the specific word line.

The specific word line may be a word line to which a specific programming voltage should be applied specially as compared with other word lines. The level of start programming voltage provided to the specific word line is desirably higher than a level of start programming voltage to be applied to the rest word lines except the specific word line. Further, the programming voltage applied during the programming operation mode may be a voltage that is increased per stage by a determined level from first and second start programming voltages whenever a programming loop count value increases within a determined limitation value. The specific word lines may be word lines positioned on the same row or different rows every block of memory cell array.

According to another aspect of the present invention, a programming circuit in a non-volatile semiconductor memory device includes a storage unit for previously storing a row address indicating at least one specific word line among a plurality of word lines; and a programming voltage supply unit for providing a start programming voltage to the specific word line, when a row address applied during a programming operation mode coincides with the stored row address, the start programming voltage having a level that is different from a level of start programming voltage to be applied to the rest word lines except the specific word line.

Herewith, the specific word line may be a word line selected by a test result of the programming loop number for memory cells connected with the plurality of word lines. The storage unit can store a row address indicating the specific word line by fuse programming using a cutable fuse element. The programming voltage supply unit supplies a first start programming voltage as a programming start voltage if the row address applied in the programming operation mode does not coincide with the stored row address, and if coinciding, the programming voltage supply unit can supply, as the programming start voltage, a second start programming voltage higher than the first start programming voltage. The programming voltage supply unit can supply a voltage that is increased per stage by a determined level from the first and second start programming voltages whenever a programming loop count value increases within a determined limitation value.

According to an exemplary embodiment of the present invention, a non-volatile semiconductor memory device includes a memory cell array, a storage unit, a match signal generator, a programming loop counting signal generator, a programming voltage generator, and a row line level selector. The memory cell array involves memory cells connected in a matrix type with a plurality of bitlines and a plurality of word lines. The storage unit previously stores row address information indicating specific word lines of the word lines. The match signal generator generates a match signal when a row address applied during a programming operation mode coincides with the row address information stored in the storage unit. The programming loop counting signal generator generates a first loop counting signal while the match signal is inactive, and generates a second loop counting signal while the match signal is active. The programming voltage generator generates a first start programming voltage as a programming start voltage in response to the first loop counting signal, and generates, as the programming start voltage, a second start programming voltage higher than the first start programming voltage in response to the second loop counting signal. The row line level selector applies a pass voltage, a read voltage, and one of programming voltages supplied from the programming voltage generator, to the word lines by row address decoding information, during the programming operation mode.

The specific word lines may be word lines selected by a test result of the programming loop number for memory cells connected with the plurality of word lines. The programming voltage generator can generate a voltage that increases per stage by a determined level from the first and second start programming voltages whenever a value of the first and second loop counting signals increases within a determined limitation value. The memory cell array can be provided with a plurality of NAND type cell blocks in which a memory cell string having a plurality of memory cells connected in series is connected to a corresponding bitline through a selected transistor, and in which a plurality of memory cells arrayed on the same row within each memory cell string are connected commonly to a corresponding word line. The storage unit may be a fuse option storage unit containing a plurality of cutable fuses. The second loop counting signal may be an integral multiple of the first loop counting signal.

That is, according to the present invention, the number of programming loops is reduced even for a word line having a relatively large loading, thus a dispersion for the number of programming loops related to an overall programming operation is reduced. Therefore, a high-speed programming operation and an operating efficiency can be obtained.

BRIEF DESCRIPTION OF THE DRAWINGS

The above and other features of exemplary embodiment of the present invention will become readily apparent from the description of the exemplary embodiments that follows, with reference to the attached drawing in which.

DETAILED DESCRIPTION OF EXEMPLARY EMBODIMENTS OF THE INVENTION

According to exemplary embodiments of the present invention, a non-volatile semiconductor memory device using a differential start programming voltage, and a programming method thereof, will be described with reference to the accompanied drawings.

It will be understood by those skilled in the art that the present invention can be embodied by numerous different types and is not limited to the following described embodiments. The following various embodiments are exemplary in nature. Accordingly, details of like components have been omitted so that the invention can be clearly presented, and like components have like reference symbols and numerals.

Figure 1:
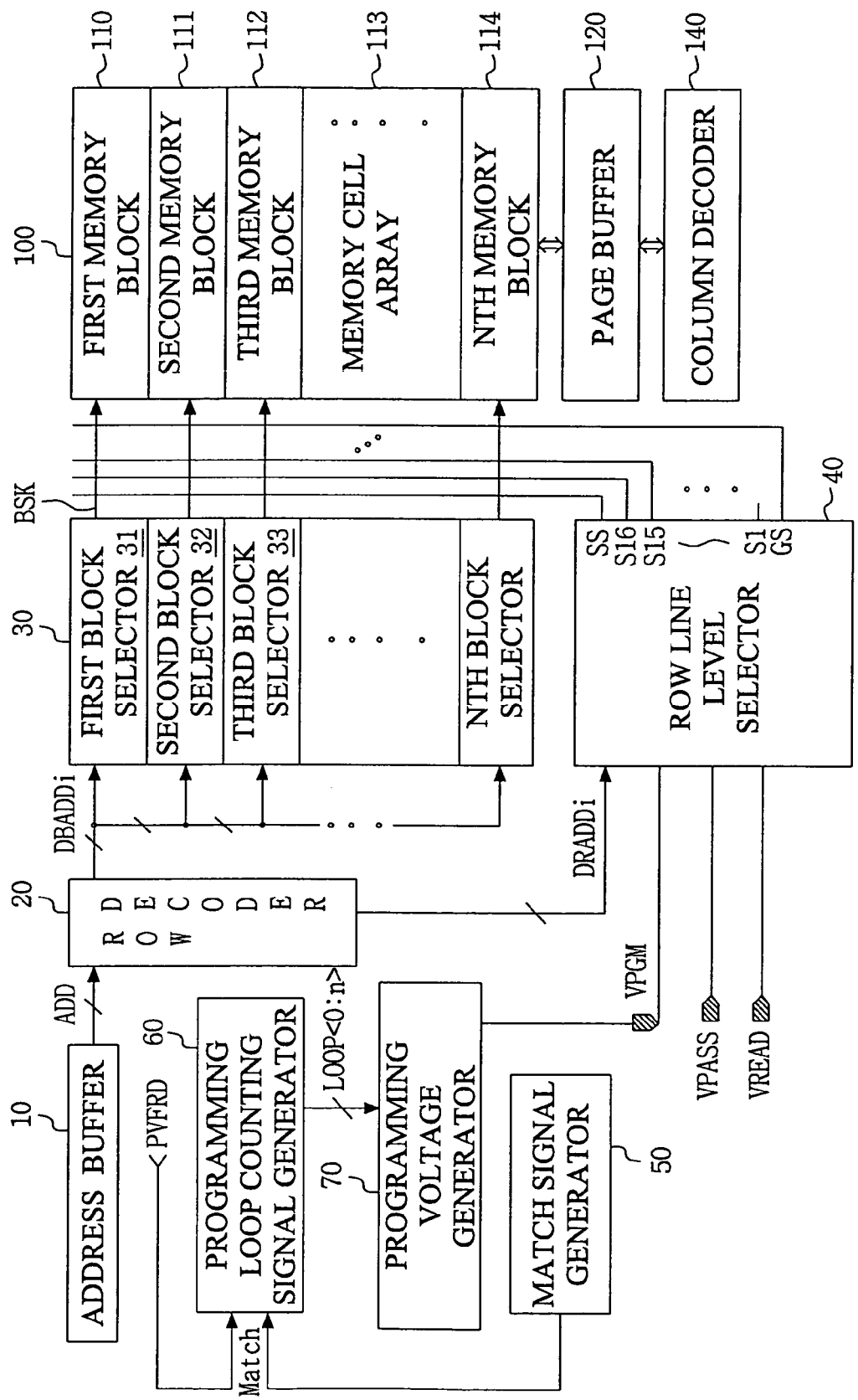
FIG. 1 is a block diagram of non-volatile semiconductor memory device according to an exemplary embodiment of the present invention.
Figure 2:
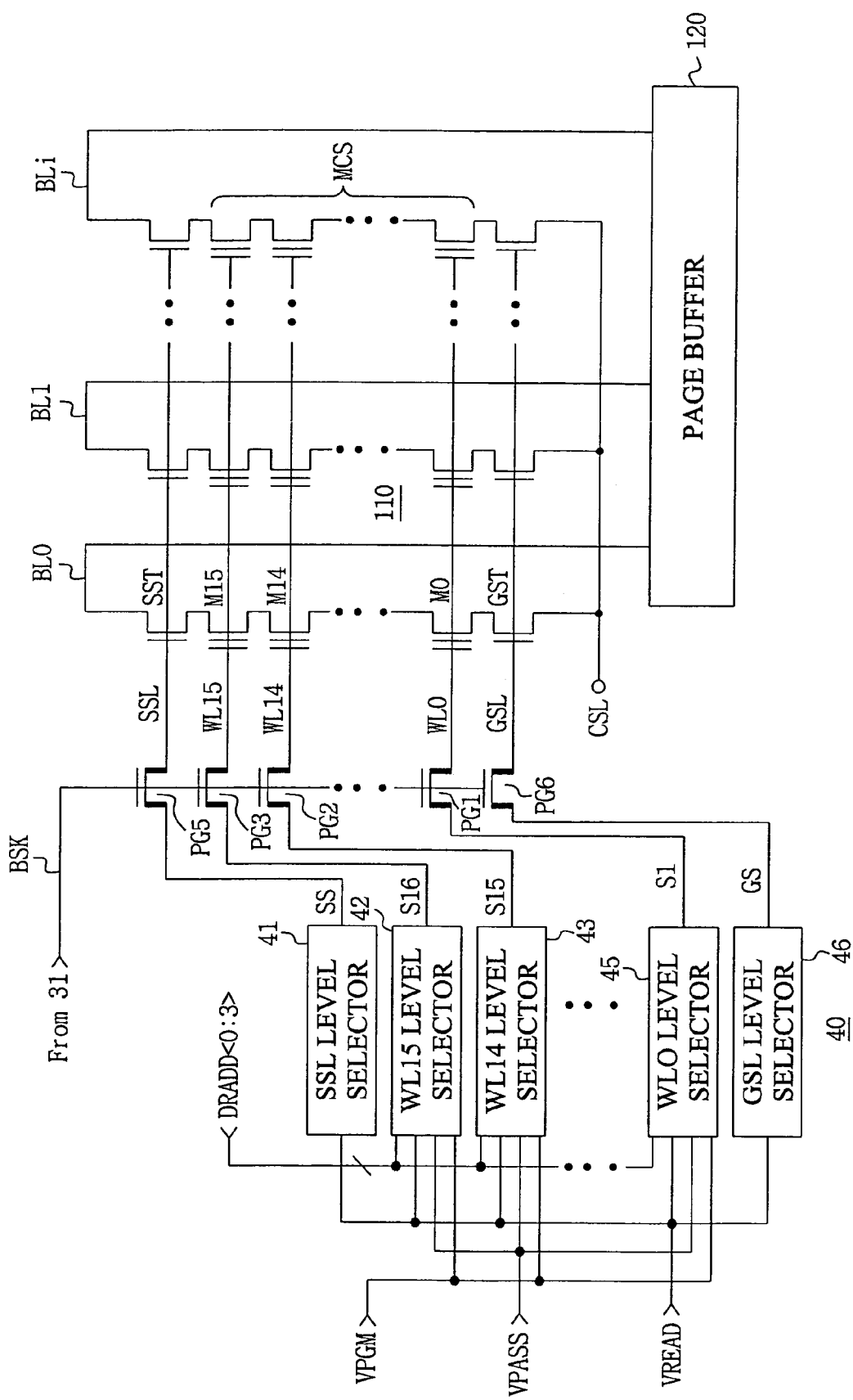
FIG. 2 is a circuit diagram showing a detailed connection relationship between a memory block and a row line level selector referred to FIG. 1.
Figure 3:
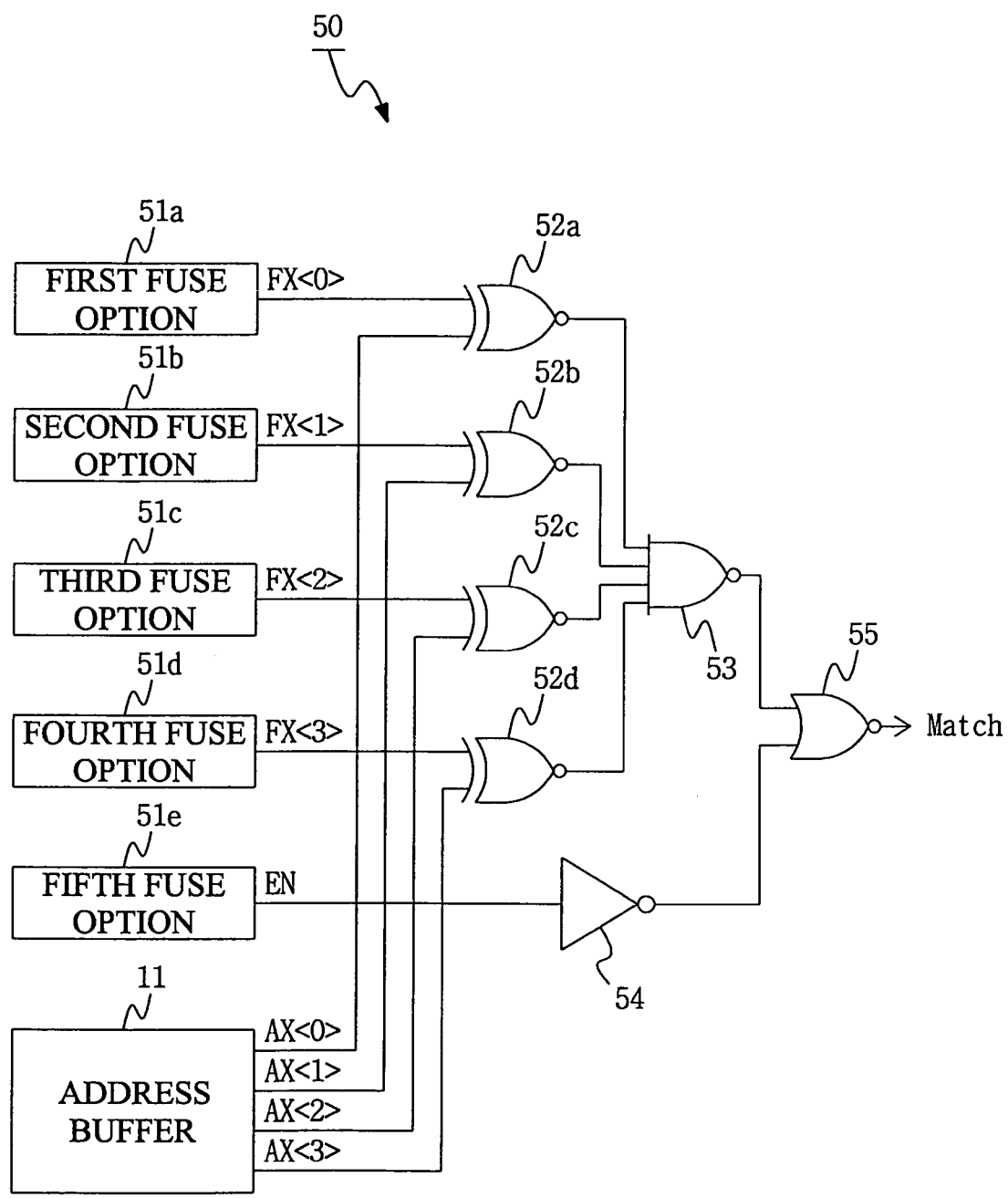
FIG. 3 is an exemplary circuit diagram of a match signal generator referred to FIG. 1.

FIG. 1 is a block diagram of non-volatile semiconductor memory device according to an exemplary embodiment of the present invention. FIG. 2 is a circuit diagram showing a detailed connection relationship between a memory block 110 and a row line level selector 40 referred to FIG. 1. FIG. 3 is an exemplary circuit diagram showing in detail a match signal generator 50 involving a storage unit, referred to FIG. 1.

Referring first to FIG. 1, there is a connective configuration between an address buffer 10, a row decoder 20, a block selector 30, a row line level selector 40, a match signal generator 50, a programming loop counting signal generator 60, a programming voltage generator 70, a memory cell array 100, a page buffer 120, and a column decoder 140.

The row line level selector 40, the match signal generator 50, the programming loop counting signal generator 60 and the programming voltage generator 70 function as a programming voltage supply unit in a programming circuit for a programming operation.

The programming circuit includes a storage unit as first to fifth fuse options referred to FIG. 3, for previously storing a row address indicating at least one specific word line among a plurality of word lines; and a programming voltage supply unit (40,50,60, and 70) for providing a start programming voltage to the specific word line, the start programming voltage having a level that is different from a level of start programming voltage to be applied to the rest word lines except the specific word line, when a row address applied during a programming operation mode coincides with the stored row address.

With reference to FIG. 2, the memory cell array 100 from FIG. 1 includes a plurality of NAND type cell blocks in which a memory cell string MCS having a plurality of memory cells M0–M15 connected in series is connected to a corresponding bitline BL0–BLi through a string selection transistor SST, and in which a plurality of memory cells arrayed on the same row within each memory cell string are connected commonly to a corresponding word line WL0–WL15. In FIG. 2, the EEPROM cell transistors M15–M0 constituting each memory cell string are connected in series between a source of the string selection transistor SST and a drain of a ground selection transistor GST. A drain of the string selection transistor SST in each memory cell string is connected to a corresponding bitline, and a source of the ground selection transistor GST is connected to a common source line CSL. Respective gates of SSTs are connected commonly to a string selection line SSL, and gates of GSTs are connected commonly to a ground selection line GSL. Control gates of the EEPROM cell transistors M15–M0 of each string are connected commonly to a corresponding word line among word lines WL0–WL15, and each bitline BL1–Bli is operationally connected to a page buffer 120. The plurality of memory cells M0–M15 as the EEPROM cell transistors are erased initially to have a threshold voltage of, such as −3V. In order to program the memory cell, a high voltage is applied to a word line of a selected memory cell during a determined time, then the voltage in the selected memory cell is changed to a higher threshold voltage, in the meantime, a threshold voltage of memory cells unselected in programming is not changed.

Figure 4:
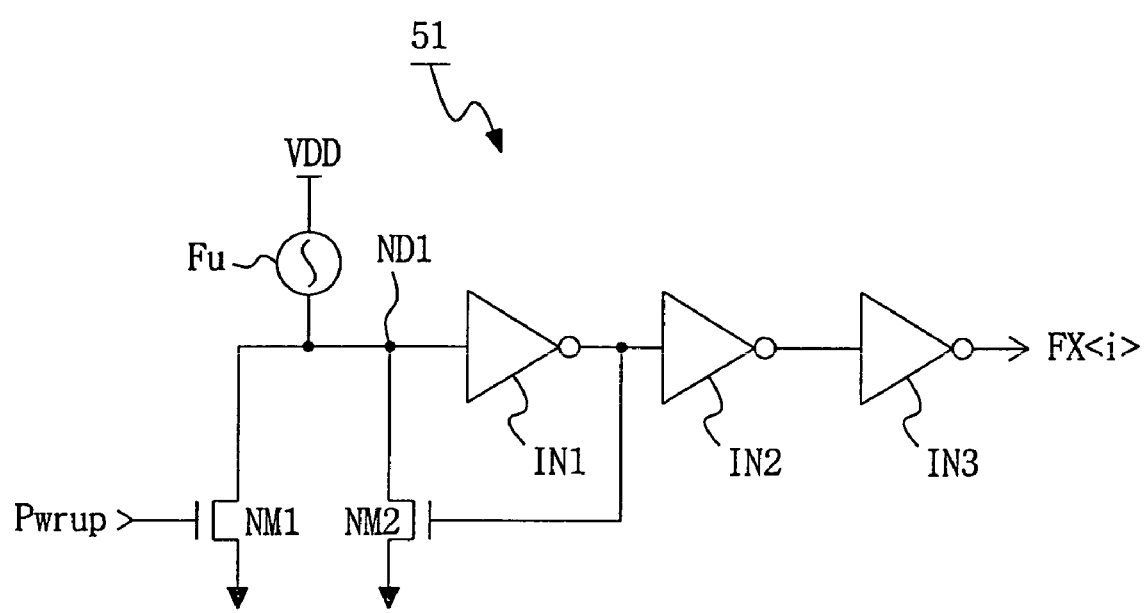
FIG. 4 is an exemplary circuit diagram of each fuse option shown in FIG. 3.

In the storage unit composed of the first to fifth fuse options 51a–51e referred to FIG. 3, row address information indicating at least one specific word line of the word lines WL0–WL15 is previously stored by a fuse cutting performed in the fuse option referred to FIG. 4. FIG. 4 is an exemplary circuit diagram illustrating in detail each fuse option referred to FIG. 3, and the circuit is constructed of a fuse Fu made of material such as polysilicon etc., N-type MOS transistors NM1, NM2, and inverters IN1–IN3. A row address of one bit is stored by a cutting or no-cutting of the fuse Fu, and one bit FXi of row address stored by the cutting of the fuse Fu is outputted as a high level when a power-up signal Pwrup is applied. Thus, four fuse options can store a row address of four bits, and one specific word line of sixteen word lines is designated by fuse program of four bits. Herewith, the fuse program indicates that optional information is stored by a cutting or no-cutting of the fuse, and this has a meaning different from a data program operation for a memory cell of the present invention.

Returning to FIG. 3, the match signal generator 50 is composed of exclusive NOR gates 52a–52d, a NAND gate 53, an inverter 54 and a NOR gate 55 as shown in FIG. 3, and generates a match signal (Match) when a row address AX0,AX1,AX2,AX3 applied in a programming operation mode coincides with the row address information stored in the storage unit. For example, if a logic level of row address for selecting a sixteenth word line WL15 is 1111, the row address 1111 and information for an enable signal are stored at the storage unit composed of the first to fifth fuse options 51a–51e. If a row address indicating a word line of a programming memory cell provided within a memory block is applied as 1111 under a programming operation mode, a logic state of the match signal (Match) generated in the NOR gate 55 is high.

Figure 5:
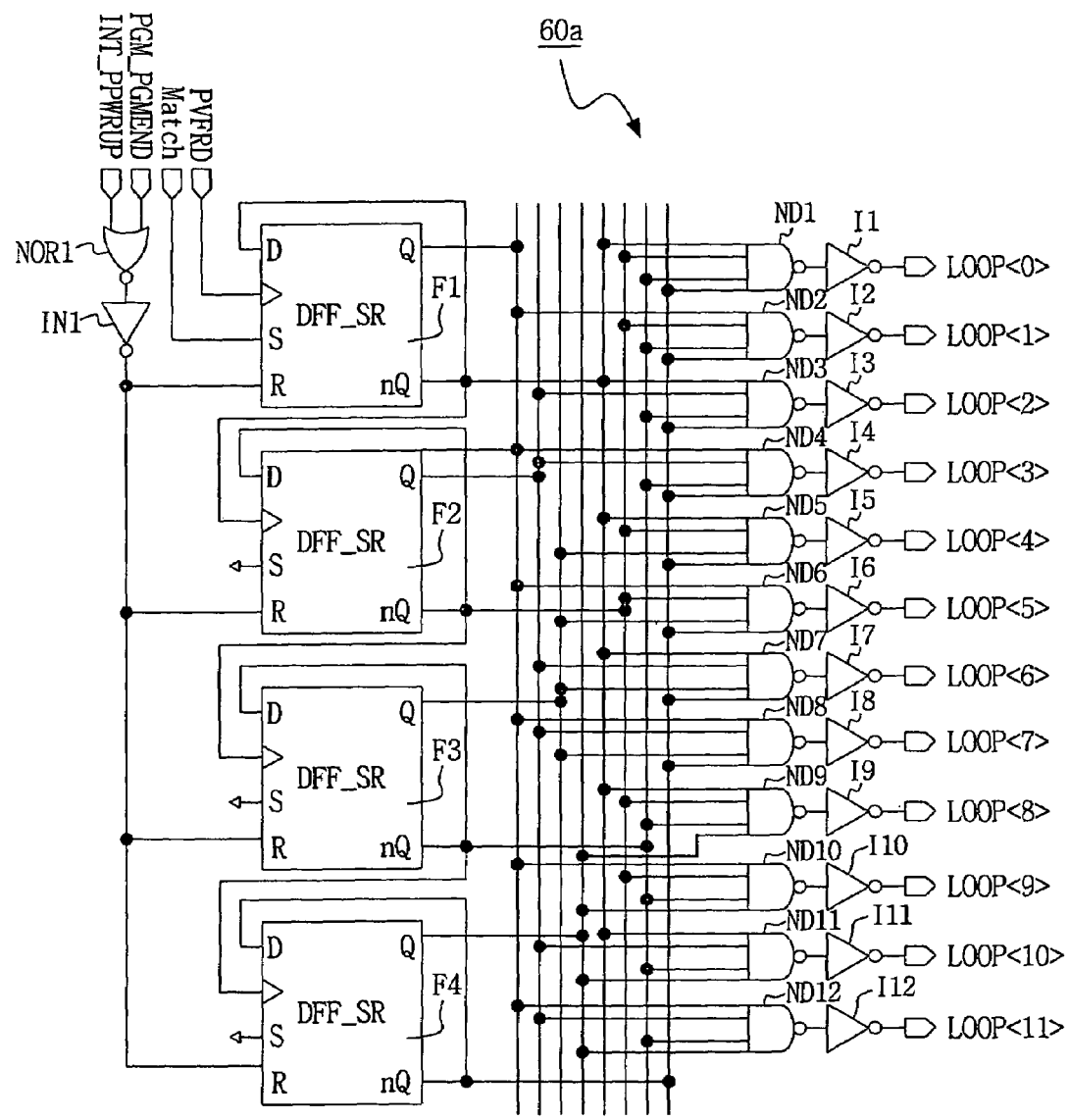
FIGS. 5 and 6 are circuit diagrams each illustrating first and second exemplary embodiments of a programming loop counting signal generator shown in FIG. 1.
Figure 6:
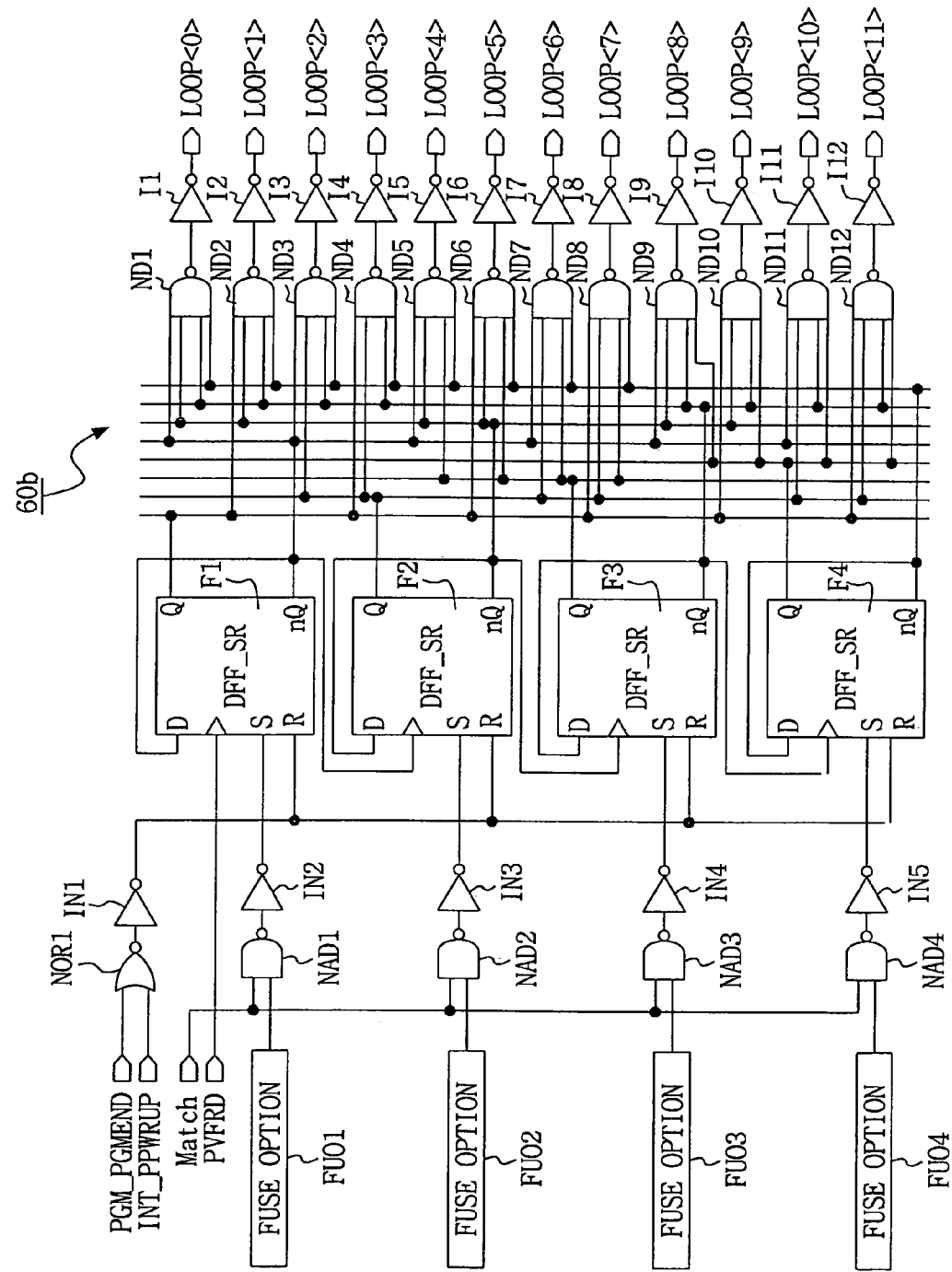
Figure 7:
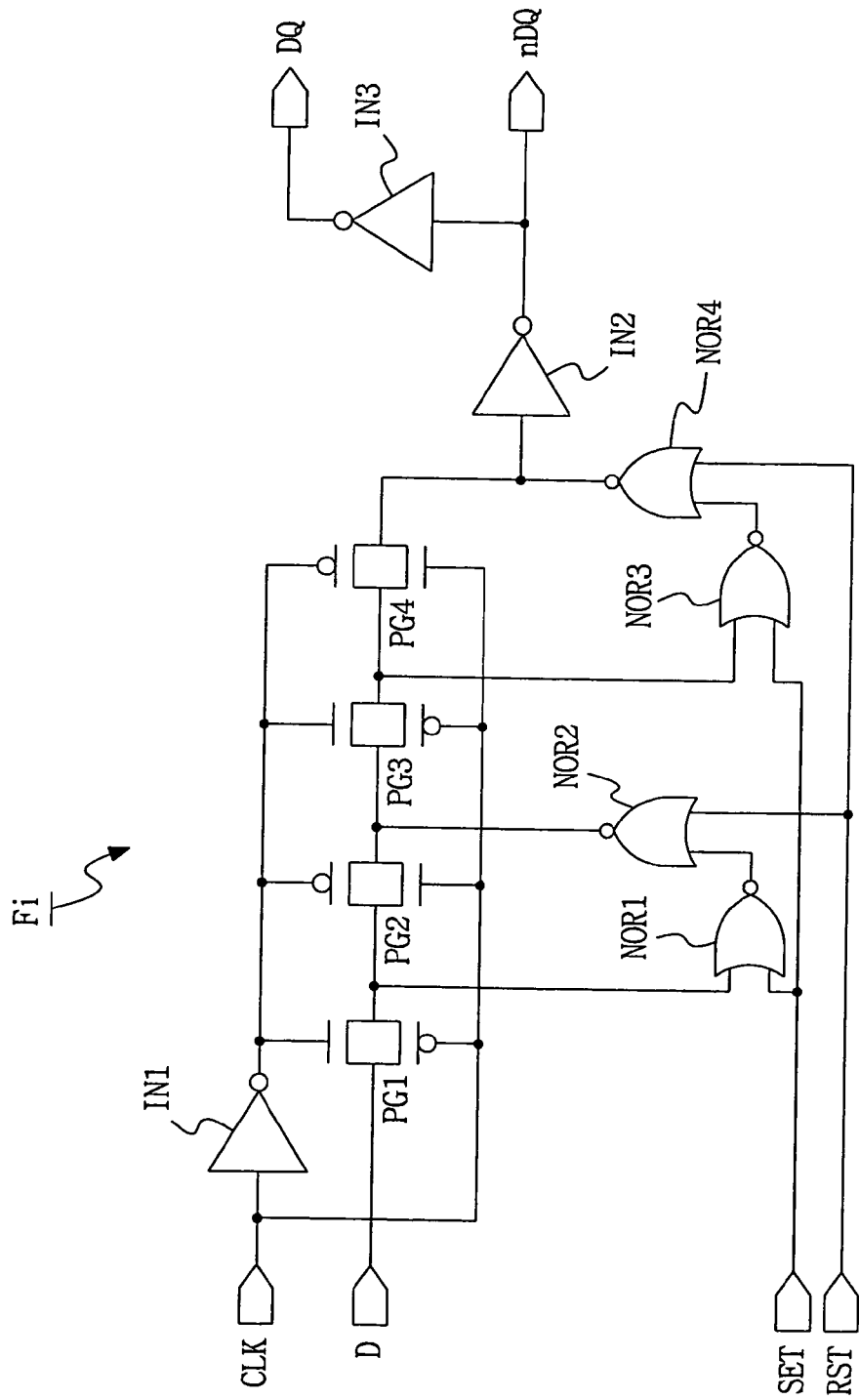
FIG. 7 is a circuit diagram showing in detail a flip-flop circuit referred to FIGS. 5 and 6.

In order to generate a first loop counting signal LOOP0 when the match signal (Match) is inactive, and to generate a second loop counting signal LOOP1 when the match signal is active, the programming loop courting signal generator 60 can be configured as shown in FIGS. 5 and 6. FIGS. 5 and 6 are circuit diagrams each illustrating first and second exemplary embodiments of the programming loop counting signal generator 60 referred to FIG. 1. FIG. 7 is a circuit diagram showing in detail a flip-flop circuit used in FIGS. 5 and 6.

Figure 8:
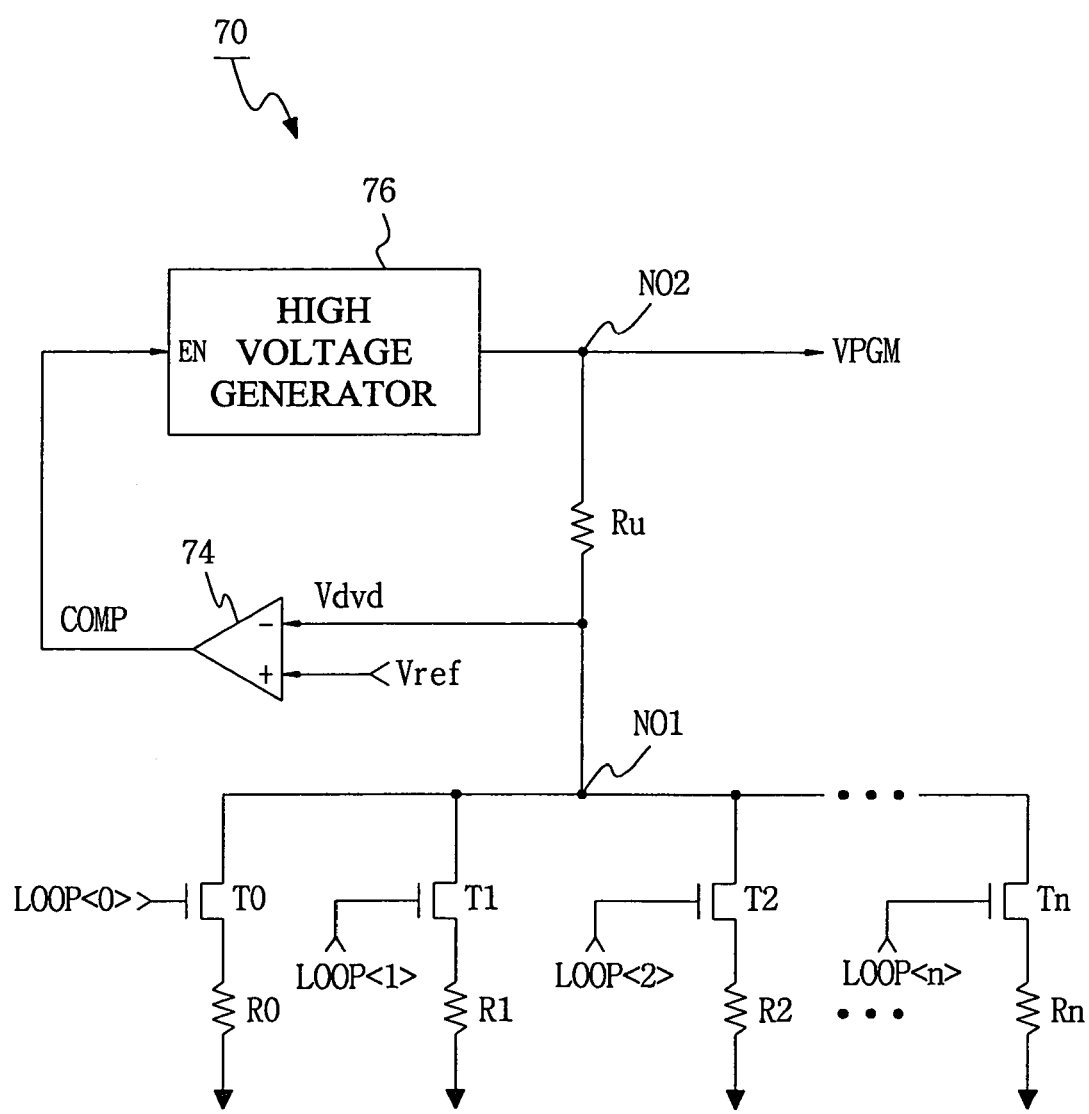
FIG. 8 is an exemplary circuit diagram showing in detail a programming voltage generator shown in FIG. 1.

With reference to FIG. 8, the programming voltage generator 70 is constructed of a high voltage generator 76, as a circuit well-known in this field, and generates a first start programming voltage, such as 15.5V, as a programming start voltage, in response to the first loop counting signal LOOP0, and generates a second start programming voltage, such as 16V, higher than the first start programming voltage, as a programming start voltage, in response to the second loop counting signal LOOP1. Herewith, since the start programming voltages having mutually different levels can be generated from one programming voltage generator 70, a burden of chip occupation area causable in embodying the programming voltage generator can be reduced substantially.

Figure 9:
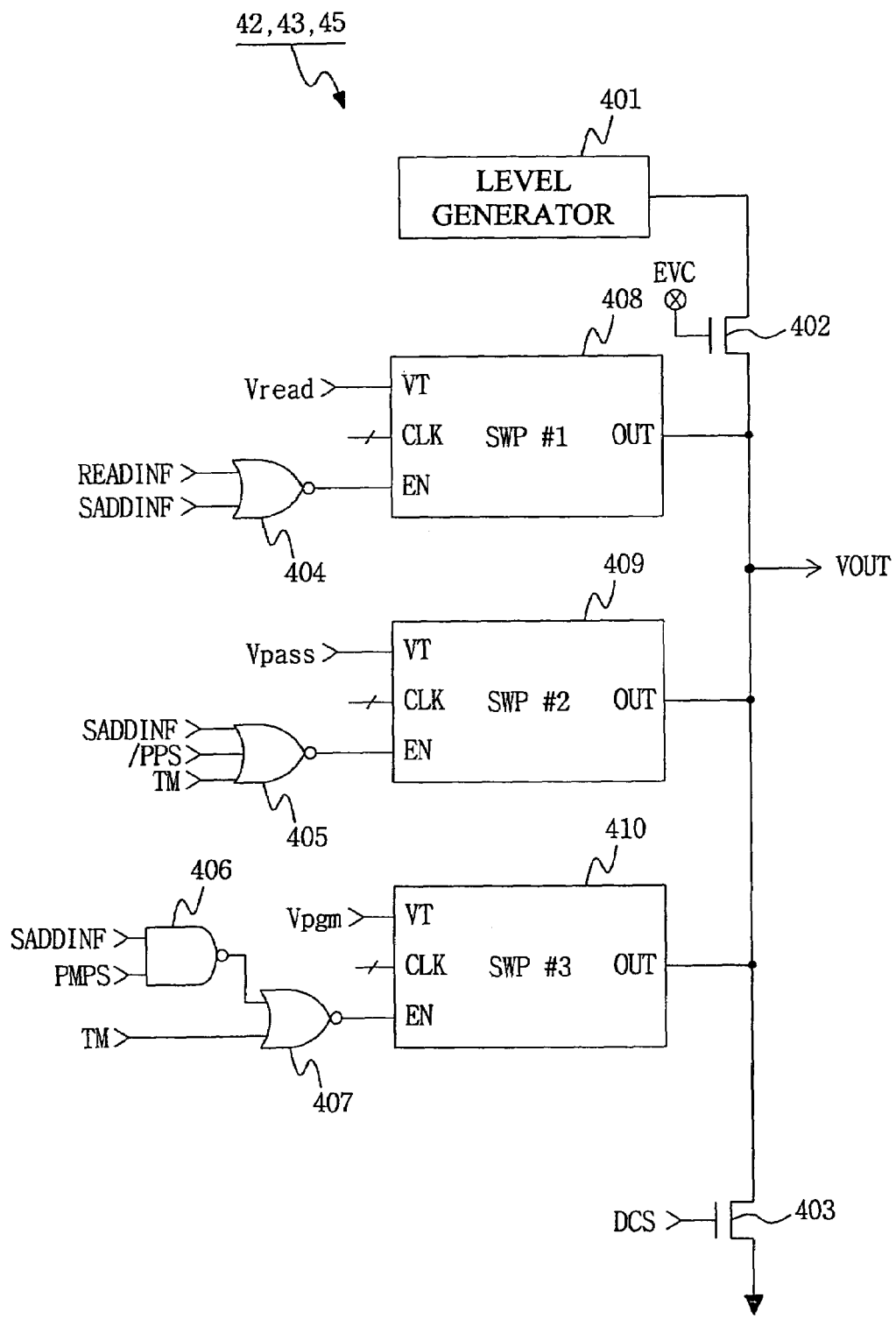
FIG. 9 is an exemplary circuit diagram showing in detail a word line level selector shown in FIG. 2.
Figure 10:
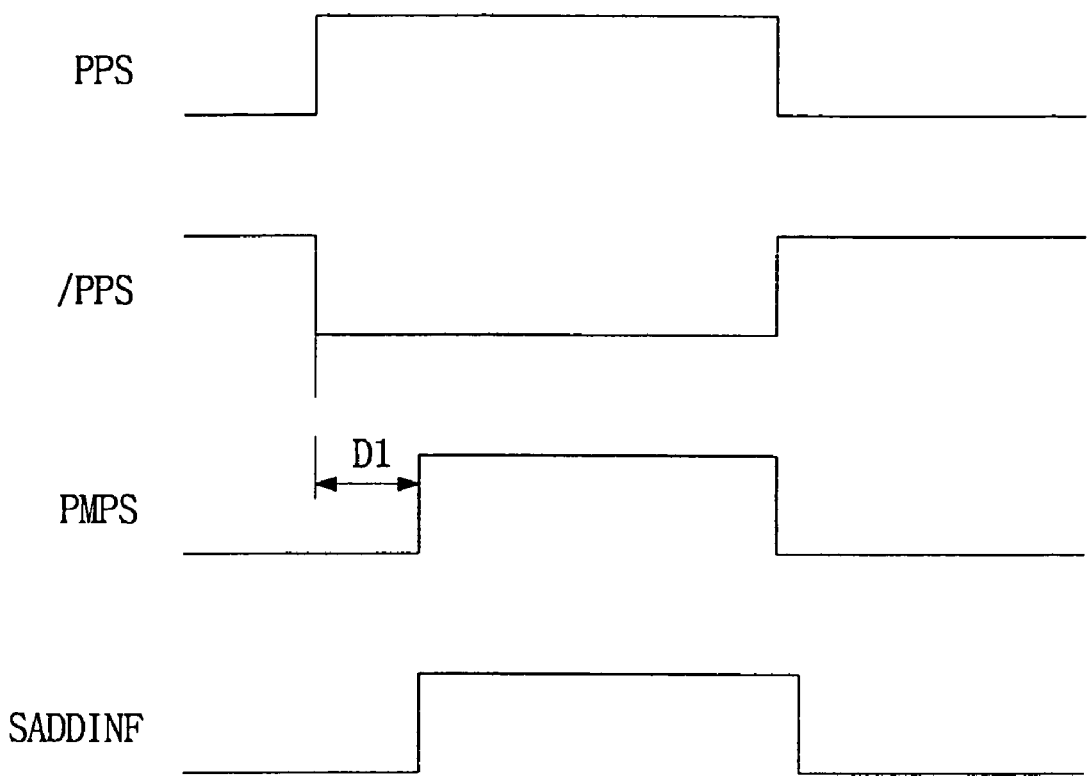
FIG. 10 is a timing diagram for operations of FIG. 9.
Figure 11:
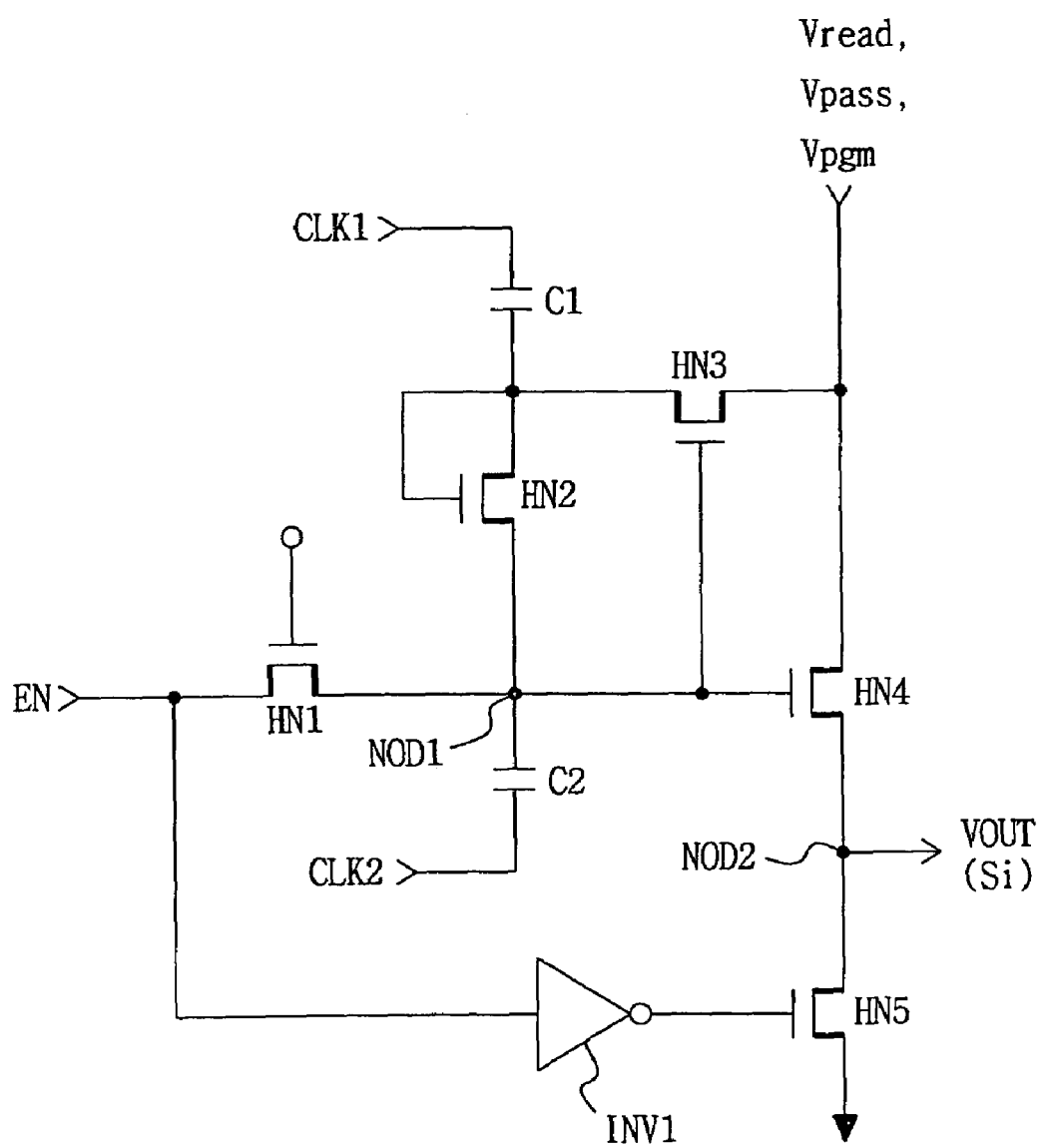
FIG. 11 is a circuit diagram illustrating in detail a switch pump referred to FIG. 9.

Referring to FIG. 9, the word line level selectors 42, 43, 45 in the row line level selector 40 are each constructed of switch pumps 408, 409, 410, and each apply a pass voltage Vpass, a read voltage Vread, and one of programming voltages VPGM1,VPGM2 provided from the programming voltage generator 70, to the word lines by row address decoding information DRADDi. FIG. 9 is an exemplary circuit diagram showing in detail the word line level selector referred to FIG. 2, and FIG. 10 is a timing diagram for operations of FIG. 9. FIG. 11 provides an example illustrating in detail the switch pump referred to FIG. 9.

Figure 12:
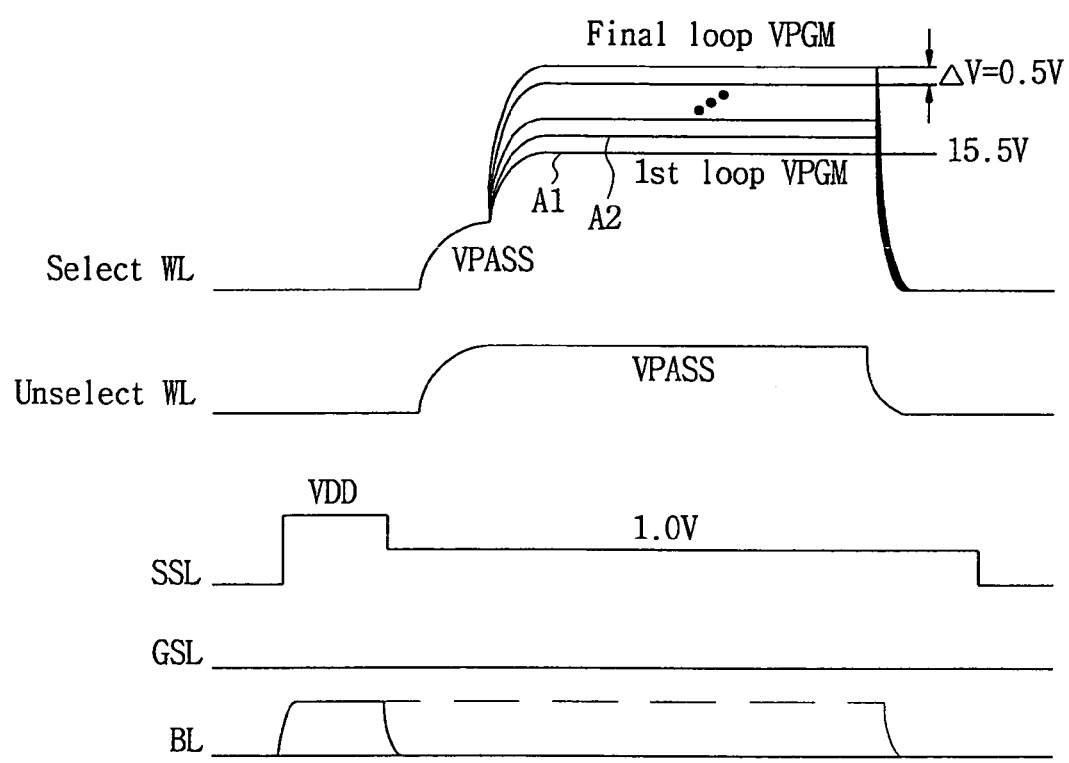
FIGS. 12 and 13 provide applied programming voltage waveforms to compare an inventive programming method with a typical programming method.
Figure 13:
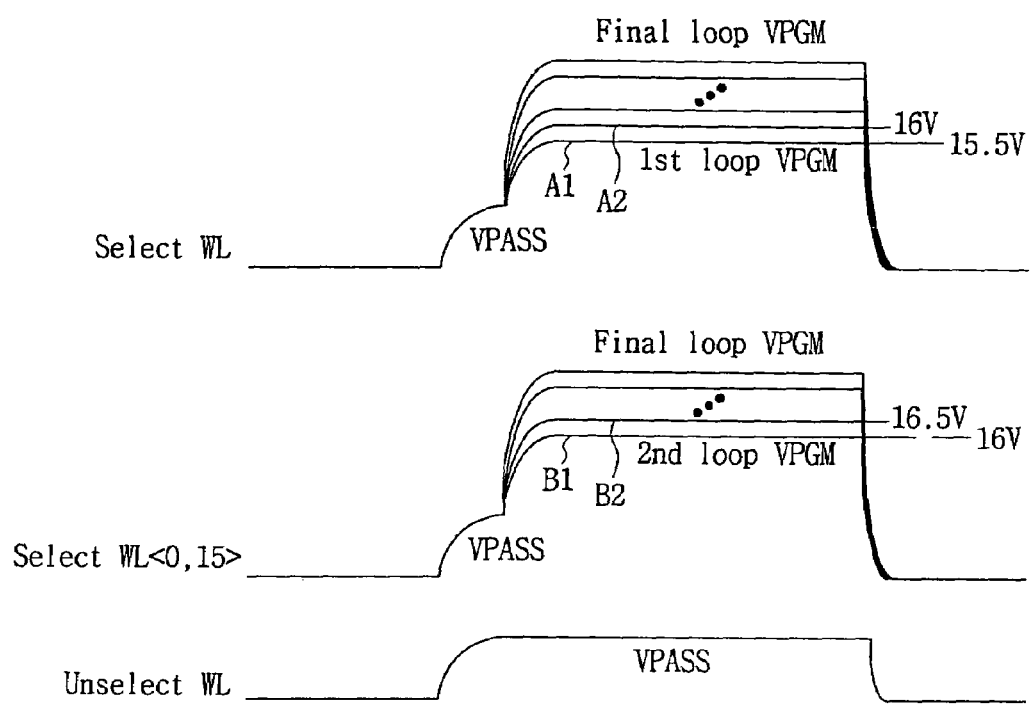

FIGS. 12 and 13 provide programming voltage waveforms to compare an inventive programming method with a typical programming method. FIG. 12 illustrates a voltage waveform based on a conventional typical ISPP programming scheme. Referring again to FIG. 2 to sufficiently understand the invention, the pass voltage VPASS is applied to all word lines WL0–WL15 at an initial programming operation mode. At this time, a voltage level of the string selection line SSL is changed from a level of power source voltage to about 1.0V, and the ground selection line is changed to a level of ground voltage, and only selected bitline is changed to a ground level. For instance, supposing that a sixteenth memory cell M15 connected to a first bitline BL0 is programmed, a program voltage A1 is applied only to the sixteenth word line WL15 after an initiation of the programming operation mode. After the pass voltage VPASS is first applied, the firstly applied programming voltage A1 is called as a start programming voltage in the inventive description. For example, if the start programming voltage A1 of 15.5V is applied in a first programming loop, a programming voltage A2 is applied as 16V increased by 0.5V from 15.5V in a second programming loop. The number of programming loops is increased, and a programming voltage of about 20V is applied in a last programming loop. A conventional programming shown in FIG. 12 is performed for all word lines without exception through the same method. Thus, in case that in the prior art, it is programmed a specific word line, such as a first word line or a sixteenth word line, having a relatively large loading capacitance for a string direction, the number of programming loops becomes relatively more than the number of programming loops for other word lines, to thus increase a dispersion for the number of programming loops.

In order to solve that problem, according to an exemplary embodiment of the present invention, if the first word line or the sixteenth word line is programmed, a start programming voltage of, such as 16V, higher than a start programming voltage of, such as 15.5V applied to one of second through fifteenth word lines, is applied from the beginning. That is, there are two kinds of start programming voltages used in the exemplary embodiment of the present invention. When a selected word line is one of second through fifteenth word lines, the start programming voltage is generated as 15.5V. When the selected word line is the first or sixteenth word line, the start programming voltage is generated as 16V. If for convenience, the start programming voltage of the former is the first start programming voltage, the voltage of the latter can be named as a second start programming voltage. In the meantime, though the specific word line was hereby decided as the first or sixteenth word line for convenience, it goes without saying that an optional word line can be decided. The specific word line can be desirably selected by a test result for the number of programming loops in memory cells connected with the plurality of word lines. For example, if the programming loop number of a third word line WL2 is the most by a process change or architecture of memory cells, row address information indicating the third word line is stored at the storage unit. Thus, when the programming voltage is applied to the third word line, a second start programming voltage is applied differentially from a first start programming voltage to be applied to other word lines. An applied voltage waveform shown in the upper side of FIG. 13 is an equal case to FIG. 12. Herewith, there is a characteristic that in case the selected word line is a first or sixteenth word line, a start programming voltage B1 is provided as 16V. Though the second start programming voltage B1 was provided as 16V herewith for a convenience, it can be determined as an optional voltage level such as 16.5V or 17V etc. Of course, the more the loop is repeated, the more the level of programming voltage applied to the word line is increased through the ISPP scheme. When a differential programming voltage is applied per word line as shown in FIG. 13, dispersion for the programming loop number is reduced substantially.

Figure 14:
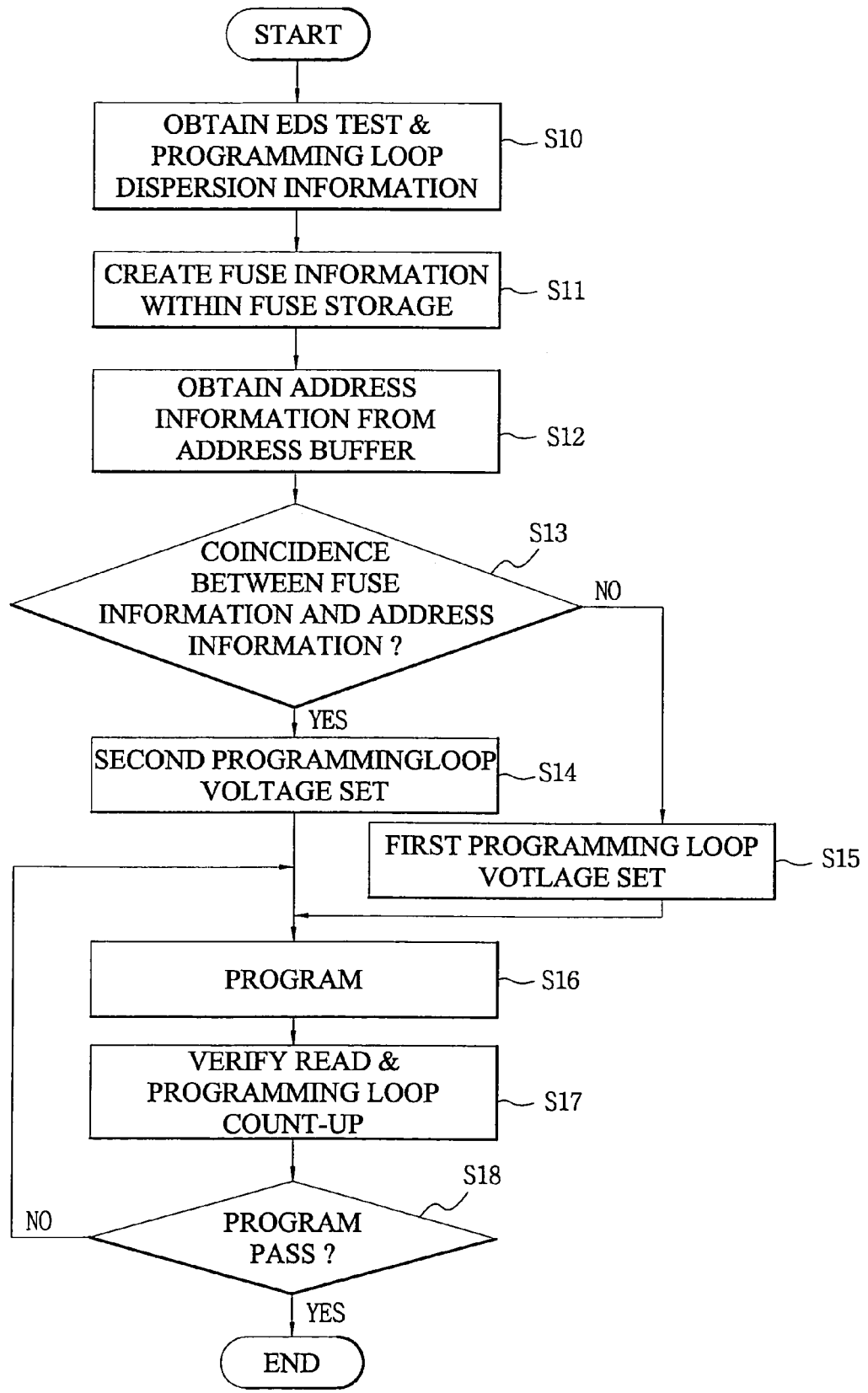
FIG. 14 is a flowchart showing a programming operation control in a programming method of the present invention.

FIG. 14 is a flowchart for a programming operation control, and provides an inventive characteristic in a programming method through steps S10 to S18. The steps are provided just for summarizing a programming method of the present invention, not meaning for a sequential operation through a control apparatus such as a computer etc.

It will be described in the steps of FIG. 14 as follows, the configuration of a programming circuit for performing an inventive programming method, and a differential programming voltage applied only to a specific word line in the inventive programming circuit, for the sake of a thorough understanding of the invention, without deviating from the spirit and scope of the present invention.

In FIG. 14, a step S10 of obtaining an electric die sorting (EDS) test and programming loop dispersion information is realized by manufacturing, on a wafer, a large number of non-volatile semiconductor memory devices having a circuit function referred to FIG. 1 and then by executing a test per chip in a wafer level. The programming loop dispersion information in the EDS test is obtained by performing a program for each memory cell under a condition same as an actual programming operation. For instance, assuming that, it appears that a programming loop is performed eleven times in testing a program of memory cell connected to a sixteenth word line, and it appears that a programming loop is performed averagely seven times or below for other word lines; a dispersion for the programming loop number is decided large comparatively. Thus, after obtaining the programming loop dispersion information in the step S10, steps of S11 and S12 are performed.

In the step S11, row address information selecting, such as a sixteenth word line, is stored at a fuse storage unit. The row address is applied to an address buffer 10 during a programming operation mode, and only by this applied operation, the step S12 can be performed. Describing in detail, a fuse Fu of FIG. 4 composed of the first through fifth fuse options 51a–51e of FIG. 3 is blown by a light source such as laser etc. Thus, row address information having logic level 1111 for selecting the sixteenth word line, and enable information having logic level 1, are stored at the storage unit. If to store row address information selecting a first word line at the storage unit, only a fuse within the fifth fuse option 51e is cut, and fuses within the first through fourth fuse options 51a–51d are not cut. In this case, the row address information having logic level 0000, for selecting the first word line, and enable information having logic level 1, are stored at the storage unit. Thus, when a row address same as the row address information stored at the storage unit is outputted from the address buffer 11 by an operation of logic gates provided with the match signal generator 50 referred to FIG. 3, an output logic level of match signal (Match) becomes high through a step S113. For example, assuming that the row address information having logic level 1111 for selecting the sixteenth word line, and the enable information having logic level 1, are stored at the storage unit in the step S11, and that the row address selecting the sixteenth word line is applied as the logic level 1111 during the programming operation mode in the step S12; all input terminals of the exclusive NOR gates 52a–52d within the match signal generator 50 become high for the logic level, thus all output levels of the exclusive NOR gates 52a–52d become high. Thus, an output of the NAND gate 53 becomes low, and an output of the inverter 54 also becomes low. The NOR gate 55 outputs a logic level high since all inputs are low, and this becomes an output level of the match signal (Match) in the step 13. In other words, when the match signal is activated as a high state in the step S113, the programming loop counting signal generator 60 of FIG. 1 outputs a counting signal for a generation of second start programming voltage. The output of the counting signal is included into a step S14. In the meantime, a step S15 is performed to generally generate a first start programming voltage.

The step S14 will be described more in detail as follows. Referring now to FIG. 5, as an example it is shown a programming loop counting signal generator 60a, which is constructed of a NOR gate NOR1, an inverter IN1, first through fourth flip-flops F1–F4, NAND gates ND1–ND12, and inverters I1–I12, through a mutually connected configuration. The first through fourth flip-flops F1–F4 are each composed of inverters IN1–IN3, first through fourth pass gates PG1–PG4, and first through fourth NOR gates NOR1–NOR4 as shown in FIG. 7. Applied signals INT_P-PWRUP,PGM_PGMEND,Match,PVFRD referred to FIG. 5 each indicate a power up signal, a programming end signal, the match signal, and a verification read signal. The verification read signal is applied as a high state, only in case that a programming memory cell has a programming fail after a verification operation.

When the match signal (Match) is applied as a low state and the first through fourth flip-flops F1–F4 are reset, all outputs of output terminals Q of the first through fourth flip-flops F1–F4 become a low state, and all outputs of inverse output terminals nQ become high, thus only an output of an NAND gate ND1 becomes low. Hence, only an output signal LOOP0 of an inverter I1 is outputted as a high state, and all outputs of the rest inverters I2–I12 become low. Then, when the verification read signal PVFRD is applied as a high state to an clock terminal, the first through fourth flip-flops F1–F4 as a 12 bit binary counter perform an increased counting operation, thereby outputting a high state through an output terminal Q of the first flip-flop F1. Thus, only an output signal LOOP1 of the inverter I2 is outputted as a high state. Continuously, whenever the verification read signal PVFRD is applied as a high state to the clock terminal, output signals LOOP2,3,4 . . . , 11 are sequentially outputted as a high state.

That is, when the match signal is inactive, a first loop counting signal LOOP0 for generating a first start programming voltage is generated first. Further, when the verification read signal PVFRD is applied as a high state, second through twelve loop counting signals LOOP1–LOOP11 for increasing a programming voltage by the ISPP scheme are sequentially outputted as a high state in a logic level.

It will be described in detail as follows that how the second loop counting signal LOOP1 is generated from the first time when the match signal is active. Since the match signal (Match) is applied to a set terminal S of the first flip-flop F1, a high state is outputted through the output terminal of the first flip-flop F1, and a low state is outputted through the inverse output terminal nQ. Thus, all inputs to a NAND gate ND2 becomes high, and an output of an inverter I2 becomes high. At this time, all outputs of the rest inverters I1,I3–I12 have a low state. In other words, while the match signal is active, the second loop counting signal LOOP1 for generating a second start programming voltage is generated from beginning. In addition, similarly, whenever the verification read signal PVFRD is applied as a high state, third through twelve loop counting signals LOOP2–LOOP11 for increasing a programming voltage by the ISPP scheme are sequentially outputted as a high state in a logic level.

Referring to FIG. 6, similarly to the configuration of circuit shown in FIG. 5, as an example it is shown a programming loop counting signal generator 60b, which is constructed of a NOR gate NOR1, inverters IN1–IN5, first through fourth NAND gates NAD1–NAD4, fuse options FUO1–FUO4, first to fourth flip-flops F1–F4, NAND gates ND1–ND12, and inverters I1–I12, through a mutually connected configuration. In FIG. 6, it is valid to produce, from the first time, an optional loop counting signal as a high level state through a fuse cutting of the fuse option FUO1–FUO4. For example, when the second flip-flop F2 is set by the fuse cutting of the fuse option FUO2, a fourth loop counting signal LOOP3 for generating a second start programming voltage is generated from beginning. Similarly, whenever the verification read signal PVFRD is applied as a high state, the rest loop counting signals LOOP4–LOOP11 for increasing a programming voltage by the ISPP scheme are sequentially outputted as a high state.

The generation of loop counting signal was described above.

The following will be provided to describe an operation of the programming voltage generator 70, referring to FIG. 8. When the first loop counting signal LOOP0 is applied as a high state, only an N-type MOS transistor T0 connected to one side of a dividing resistance R0 among dividing resistances R0–Rn shown in FIG. 8 is turned on, and the rest N-type MOS transistors T1–Tn are turned off. Thus, only the resistance R0 is connected between a node NO1 and a ground terminal. A dividing voltage Vdvd based on a resistance rate of an upper resistance Ru and the resistance R0 is applied to an inverted terminal (−) of comparator 74, and a reference voltage Vref is applied to a non-inverted terminal (+) of the comparator 74. When the dividing voltage Vdvd is lower than the reference voltage Vref, a comparison signal COMP outputted from the comparator 74 is activated. The comparison signal outputted from the comparator 74 is applied to an enable terminal EN of the high voltage generator 76, thus the high voltage generator 76 performs a charge pumping operation by a logic state of the comparison signal COMP, to thus output a targeted programming voltage VPGM to a node NO2. At this time, the outputted programming voltage VPGM can be determined as about 15.5V as a start programming voltage.

If a start programming voltage of 16V is applied to a specific word line, such as a sixteenth word line, the second loop counting signal LOOP1 is applied as a high state. Thus, only an N-type MOS transistor T1 connected to one side of a dividing resistance R1 among the dividing resistances R0-Rn shown in FIG. 8 is turned on, and the rest N-type MOS transistors T0, T2–Tn are turned off. Hence, only the resistance R1 is operationally connected between the node NO1 and the ground terminal. The dividing voltage Vdvd based on a resistance rate of the upper resistance Ru and the resistance R1 is reduced by a determined level rather than the dividing voltage based on the resistance rate of the upper resistance Ru and the resistance R0. Thus, a target output level based on a charge pumping operation of the high voltage generator 76 is more increased, to determine, as about 16V, the programming voltage VPGM outputted to the node NO2. Since resistance values of the dividing resistances R0–Rn are determined differently, a level of programming voltage outputted through the node NO2 is gradually increased by an order of the loop counting signal. According to the ISPP scheme, namely, a method of increasing per stage the programming voltage VPGM in each programming cycle, when the programming voltage is applied to the word line WL15, 14 adjacent to the string selection line SSL of FIG. 2, the increase of the SSL voltage provided through a coupling with the word line is substantially reduced. That is, since an increased width of programming voltage used in each programming cycle is small, a boosting effect through the coupling between the string selection line and the word line can be restrained substantially.

As was described above, the programming voltage generator 70 generates a first start programming voltage as a programming start voltage in response to a first loop counting signal, and generates a second start programming voltage higher than the first start programming voltage, as the programming start voltage, in response to a second loop counting signal.

Referring back to FIG. 1, the programming voltage VPGM applied to the row line level selector 40 can be provided as two kinds of voltage levels, such as 15.5V and 16V, by a logic level of the match signal (Match) outputted from the match signal generator 50. This describes a step S14 of performing a second programming loop voltage set and a step S15 of performing a first programming loop voltage set, in the flowchart of FIG. 14.

A programming operation of step S16 is performed by applying the programming voltage to a selected word line. The operation of step S16 is controlled by the row line level selector 40 shown in FIG. 1. With reference to FIG. 2, the programming voltage VPGM, the pass voltage VPASS, the read voltage VREAD, and a decoding row address DRADD0, DRADD1, DRADD2, DRADD3 are commonly applied to the word line level selectors 42–45 provided in the row line level selector 40. The read voltage VREAD is applied commonly to a string selection line level selector 41 and a ground selection line level selector 46. The word line level selectors 42–45 are each composed of circuit elements shown in FIG. 9. When the switch pump 408 of three switch pumps 408,409,410 is enabled, the read voltage VREAD appears in a voltage output terminal VOUT, and when the switch pump 409 is enabled, the pass voltage VPASS appears in the voltage output terminal VOUT. When the switch pump 410 is enabled, the programming voltage VPGM appears in the voltage output terminal VOUT. Applied signals READINF,SADDINF,/PPS,TM,PMPS for a generation of enable signals applied to the enable terminals EN of the switch pumps 408,409,410 are each as read information, selected address information, a pass cycle signal, a test mode signal, and a programming cycle signal. FIG. 10 provides a timing relationship of the signals. An applied time of the programming cycle signal is delayed by a delay time D1 from a time point when the pass cycle signal is activated. Therefore, to all the word lines, the pass voltage is first applied, and then, the programming voltage is applied only to a selected word line. In FIG. 9, a signal DCS applied to a gate of N-type MOS transistor 403 is a discharge control signal. FIG. 11 illustrates a detailed circuit configuration of the switch pumps 408,409,410. Capacitors C1, C2 and high voltage transistors HN1–HN5 are devices necessary for a charge pumping and switching operation, and the charge pumping and switching operation is widely well-known in this field.

The word line level selectors 42–45 each apply the pass voltage VPASS, the read voltage VREAD, and one of the programming voltages VPGM1,VPGM2 provided from the programming voltage generator, to a corresponding word line by the row address decoding information DRADDi, during a programming operation mode.

Referring back to FIG. 2, in a case that the second start programming voltage VPGM2 is applied to the sixteenth word line, an output line BSK of first block selection unit 31 referred to FIG. 1 is first activated, hence all high voltage transistors PG1–PG6 are activated, to select one block. At this time, all the word line level selectors output the pass voltage VPASS through output terminals S1–S16, and the string selection line level selector 41 and the ground selection line level selector 46 output the read voltage VREAD. Thus, the pass voltage VPASS is applied to all the word lines. The word line level selector 42 outputs the second start programming voltage VPGM2 through the output terminal S16. Therefore, the second start programming voltage VPGM2 is applied only to the sixteenth word line WL15, and the pass voltage VPASS is still applied to the first through fifteenth word lines WL0–WL14. When only a level of the bitline BL0 is changed to a ground level, the memory cell transistor M15 is programmed. The program indicates that data is written in a floating gate of memory cell transistor, and a mechanism for that is well known in this field. When only a bitline BL1 is changed to the ground level, it is programmed a memory cell which is connected to the bitline BL1 and whose control gate is connected to the word line WL15. In a step S17 of FIG. 14, upon a program verification read and program loop count-up are performed by the well-known method, a program pass or fail check is performed at S18 by the well-known method. In the program fail, the programming loop counting signal generator 60 outputs a third loop counting signal LOOP2 as a high state. Thus, the programming voltage is increased to 16.5V. Consequently, a level of the programming voltage applied to the sixteenth word line is increased through the ISPP scheme according to the repeated loop. Herewith, the sixteenth word line receives the start programming voltage as 16V, thus similarly to other word lines receiving 15.5V as the start programming voltage, the number of programming loops can be obtained. That is, if the number of programming loops appeared as 8 times in programming the third word line, it can appear even in programming the sixteenth word line as 8 or 9 times. This is the loop number substantially reduced, as compared with the loop number of conventional sixteenth word line in which the loop number appeared as, such as 11 times. That is, it indicates that dispersion for the number of programming loops is reduced. When the dispersion for the programming loop number is reduced, a high-speed programming operation and efficiency in the programming and read operation can be enhanced.

Though the second start programming voltage was exampled as 16V in the above-description, it can be, of course, determined as an optional voltage such as 17V or 18V etc.

In addition, though the NAND flash semiconductor memory device was described above as an example of the invention, a programming method of NOR flash semiconductor memory device is also applicable to the dispersion reduction of programming loop number.

As described above, according to the present invention, dispersion for the number of programming loops is reduced, to thus realize a high-speed programming operation and operating efficiency.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. For instance, the number of word lines designated as the specific word line and its designating method can be varied diversely. Additionally it can be specially installed and operated the programming voltage generator for applying a specific programming voltage to a specific word line in case an occupied area is permitted to increase, or it can be embodied a row address storing method through a metal option or an external control signal, in stead of the method of memorizing a specific word line through a fuse option. Accordingly, these and other changes and modifications are seen to be within the true spirit and scope of the invention as defined by the appended claims.

What is claimed is:

1. A programming circuit in a non-volatile semiconductor memory device, comprising:
    a storage unit to store a row address indicating at least one specific word line among a plurality of word lines; and
    a programming voltage supply unit to provide a start programming voltage to the specific word line, when a row address applied in a programming operation mode coincides with the stored row address, said start programming voltage having a level different from a level of start programming voltage to be applied to the rest word lines except the specific word line.

2. The circuit as claimed in 1, wherein the at least one specific word line is a word line selected by a test result of the programming loop number for memory cells connected to the plurality of word lines.

3. The circuit as claimed in 2, wherein the programming voltage supply unit supplies a first start programming voltage as a programming start voltage if the row address applied in the programming operation mode does not coincide with the stored row address, and supplies, as the programming start voltage, a second start programming voltage higher than the first start programming voltage, if coinciding.

4. The circuit as claimed in 3, wherein the programming voltage supply unit supplies a voltage that is increased per stage by a determined level from the first and second start programming voltage whenever a programming loop count value increases within a determined limitation value.

5. The circuit as claimed in 1, wherein the storage unit stores the row address indicating the specific word line through use of a fuse programming.

6. The circuit as claimed in 1, wherein a level of the start programming voltage provided to the specific word line is higher than a level of the start programming voltage to be applied to the rest word lines except the specific word line.

7. A non-volatile semiconductor memory device comprising:
    a memory cell array involving memory cells which are connected in a matrix type with a plurality of bitlines and a plurality of word lines;
    a storage unit to store row address information indicating specific word lines among the word lines;
    a match signal generator to generate a match signal when a row address applied in a programming operation mode coincides with the row address information stored in the storage unit;
    a programming loop counting signal generator to generate a first loop counting signal when the match signal is inactive, and to generate a second loop counting signal when the match signal is active;
    a programming voltage generator to generate a first start programming voltage as a programming start voltage in response to the first loop counting signal, and generating, as the programming start voltage, a second start programming voltage higher than the first start programming voltage in response to the second loop counting signal; and
    a row line level selector to apply a pass voltage, a read voltage, and one of programming voltages supplied from the programming voltage generator, to the word lines by row address decoding information, during the programming operation mode.

8. The device as claimed in 7, wherein the specific word lines are word lines selected by a test result of the programming loop number for memory cells connected to the plurality of word lines.

9. The device as claimed in 7, wherein the programming voltage generator generates a voltage that increases per stage by a determined level from the first and second start programming voltages whenever a value of the first and second loop counting signals increases within a determined limitation value.

10. The device as claimed in 7, wherein the memory cell array comprises a plurality of NAND type cell blocks in which a memory cell string having a plurality of memory cells connected in series is connected to a corresponding bitline through a selected transistor, and in which a plurality of memory cells arrayed on the same row within each memory cell string are connected commonly to a corresponding word line.

11. The device as claimed in 7, wherein the storage unit is a fuse option storage unit involving a plurality of cutable fuses.

12. The device as claimed in 7, wherein the second loop counting signal is an integral multiple of the first loop counting signal.

13. A programming method in a non-volatile semiconductor memory device, said method comprising:
    storing a row address that indicates at least one specific word line among a plurality of word lines; and
    applying a start programming voltage to the specific word line when a row address applied in a programming operation mode coincides with the stored row address, said start programming voltage having a level that is different from a level of start programming voltage to be applied to the rest word lines except the specific word line.

14. The method as claimed in 13, wherein the specific word line has an applied specific programming voltage as compared with other word lines.

15. The method as claimed in 13, wherein a level of the start programming voltage provided to the specific word line is higher than a level of start programming voltage to be applied to the rest word lines except the specific word line.

16. The method as claimed in 15, wherein the specific word line is a word line positioned on the same row every block of memory cell array.

17. The method as claimed in 15, wherein the specific word lines are word lines positioned on different rows every block of memory cell array.

18. The method as claimed in 13, wherein the programming voltage applied during the programming operation mode has a voltage that increases per stage by a determined level from first and second start programming voltages whenever a programming loop count value increases within a determined limitation value.

19. A programming method in a NAND-type flash semiconductor memory device, said method comprising:
   storing a row address indicating at least one specific word line among a plurality of word line;
   applying a ground voltage to a selected bitline; and
   applying a start programming voltage to specific word lines among a plurality of word lines, when a row address applied in a programming operation mode coincides with the stored row address, wherein the start programming voltage as a level different from a level of a start programming voltage to be applied to word lines among the plurality of word lines except the specific word ling.

20. The method as claimed in 19, wherein the specific word lines in comparison with other word lines are word lines to which the specific programming voltage should be applied.

21. The method as claimed in 19, wherein a level of the start programming voltage provided to the specific word lines is higher than a level of start programming voltage to be applied to the rest word lines except the specific word lines.

22. The method as claimed in 19, wherein the specific word lines are word lines positioned on the same row every block of memory cell array.

23. The method as claimed in 19, wherein the specific word lines are word lines positioned on different rows every block of memory cell array.

24. A programming method in a non-volatile semiconductor memory device, said method comprising:
   storing row address information indicating a specific word line among a plurality of word lines;
   applying a ground voltage to a bitline connected to a memory cell selected in a programming operation mode;
   applying a first start programming voltage to a word line connected to the selected memory cell when a row address applied in the programming operation mode does not coincide with the stored row address information;
   applying a second start programming voltage higher than a level of the first start programming voltage, to the word line connected to the selected memory cell and corresponding to the applied row address, when the applied row address coincides with the stored row address information;
   performing a program verification for the selected memory cell;
   applying a first increase loop programming voltage increased by a determined level from the first start programming voltage, to the word line, if the memory cell having the applied first start programming voltage is decided as a verification fail;
   applying a second increase loop programming voltage increased by a determined level from the second start programming voltage, to the word line, if the memory cell having the applied second start programming voltage is decided as the verification fail;
   stopping a programming for the selected memory cell if the selected memory cell was decided as a verification pass in the program verification performing step; and
   repeating the program verification for the memory cell having the applied first and second increase loop programming voltages, and then applying a programming voltage increased per stage on the basis of a verified result, to the word line, every the verification fail, within a determined loop number, or stopping the programming in the verification pass.

25. The method as claimed in 24, wherein the second start programming voltage is about 16V when the first start programming voltage is about 15.5V.

26. The method as claimed in 24, wherein the row address information is stored by a fuse cutting.

* * * * *